(12) United States Patent
Holscher et al.

(10) Patent No.: US 6,274,292 B1
(45) Date of Patent: *Aug. 14, 2001

(54) SEMICONDUCTOR PROCESSING METHODS

(75) Inventors: Richard Holscher; Zhiping Yin, both of Boise; Tom Glass, Idaho City, all of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,618

(22) Filed: Feb. 25, 1998

(51) Int. Cl.$^7$ ............................................ G03F 7/00

(52) U.S. Cl. .................................... 430/313; 430/950

(58) Field of Search ................................ 430/313, 327, 430/330, 311, 950

(56) References Cited

U.S. PATENT DOCUMENTS

| | | | |
|---|---|---|---|
| 4,954,867 | 9/1990 | Hosaka | 357/52 |
| 5,034,348 | 7/1991 | Hartswick et al. | 437/200 |
| 5,340,621 | 8/1994 | Matsumoto et al. | 427/571 |
| 5,441,797 | * 8/1995 | Hogan et al. | 428/209 |

(List continued on next page.)

FOREIGN PATENT DOCUMENTS

| | | |
|---|---|---|
| 0 471 185 A2 | 7/1991 | (EP) . |
| 0 588 087 A2 | 8/1993 | (EP) . |
| 0 588 087 A3 | 8/1993 | (EP) . |
| 0 778 496 A2 | 5/1996 | (EP) . |
| 6-068019 | * 3/1994 | (JP) . |
| 09055351 | 2/1997 | (JP) . |

OTHER PUBLICATIONS

Article: Bencher, C. et al., "Dielectric antireflective coatings for DUV lithography", Solid State Technology (Mar. 1997), pp. 109–114.

Text: Wolf, S. et. al., "Silicon Processing For The VLSI Era", vol. 1, pp. 437–441, 1986.

Text: Jenkins, F. et. al., "Fundamentals Of Optics", Properties Of Light, pp. 9–10, Dec., 1976.

Text: Heavens, O.S., "Optical Properties Of Thin Solid Films", pp. 48–49, Dec., 1991.

Article: Dammel, R.R., et. al., "Dependence Of Optical Constants Of AZ® BARLi™ Bottom Coating On Bake Conditions", SPIE vol. 3049 (1997), pp. 963–973.

Noboru Shibata, "Plasma–Chemical Vapor–Deposited Silicon Oxide/Silicon Oxynitride Double–Layer Antireflective Coating for Solar Cells", Japanese Journal of Applied Physics, vol. 30, No. 5, May 1991, pp. 997–1001.

D. R. McKenzie et al., "New Technology for PACVD$^{1}$", Surface and Coating Technology, 82 (1996), pp. 326–333.

*Primary Examiner*—Kathleen Duda
(74) *Attorney, Agent, or Firm*—Wells, St. John, Roberts, Gregory & Matkin, P.S.

(57) ABSTRACT

In one aspect, the invention includes a semiconductor processing method. An antireflective material layer is formed over a substrate. At least a portion of the antireflective material layer is annealed at a temperature of greater than about 400° C. A layer of photoresist is formed over the annealed antireflective material layer. The layer of photoresist is patterned. A portion of the antireflective material layer unmasked by the patterned layer of photoresist is removed. In another aspect, the invention includes the following semiconductor processing. An antireflective material layer is formed over a substrate. The antireflective material layer is annealed at a temperature of greater than about 400° C. A layer of photoresist is formed over the annealed antireflective material layer. Portions of the layer of photoresist are exposed to radiation waves. Some of the radiation waves are absorbed by the antireflective material during the exposing.

6 Claims, 1 Drawing Sheet

U.S. PATENT DOCUMENTS

| | | | |
|---|---|---|---|
| 5,472,827 * | 12/1995 | Ogawa et al. | 430/315 |
| 5,472,829 | 12/1995 | Ogawa | 430/325 |
| 5,591,566 | 1/1997 | Ogawa | 430/325 |
| 5,600,165 | 2/1997 | Tsukamoto et al. | 257/323 |
| 5,641,607 | 6/1997 | Ogawa et al. | 430/272.1 |
| 5,648,202 | 7/1997 | Ogawa et al. | 430/325 |
| 5,670,297 | 9/1997 | Ogawa et al. | 430/318 |
| 5,674,356 | 10/1997 | Nagayama | 430/316 |
| 5,677,111 | 10/1997 | Ogawa | 430/313 |
| 5,698,352 | 12/1997 | Ogawa et al. | 430/14 |
| 5,710,067 * | 1/1998 | Foote et al. | 437/238 |
| 5,731,242 | 3/1998 | Parat et al. | 438/586 |
| 5,741,721 | 4/1998 | Stevens . | |
| 5,759,755 * | 6/1998 | Park et al. | 430/512 |
| 5,831,321 | 11/1998 | Nagayama | 257/412 |
| 5,838,052 * | 11/1998 | McTeer | 257/437 |
| 5,872,385 | 2/1999 | Taft et al. | 257/437 |
| 5,960,289 | 9/1999 | Tsui et al. | 438/275 |
| 5,968,324 | 10/1999 | Cheung et al. | 204/192.28 |
| 6,008,124 | 12/1999 | Sekiguchi | 438/653 |
| 6,020,243 | 2/2000 | Wallace et al. | 438/287 |

* cited by examiner

SEMICONDUCTOR PROCESSING METHODS

TECHNICAL FIELD

The invention pertains to semiconductor processing methods, such as, for example, methods of patterning photoresist in which an antireflective material is utilized to attenuate (for example, absorb) radiation.

BACKGROUND OF THE INVENTION

Semiconductor processing frequently involves providing a photoresist layer over a substrate. Portions of the photoresist layer are subsequently exposed to light through a masked light source. The mask contains clear and opaque features defining a pattern to be created in the photoresist layer. Regions of the photoresist layer which are exposed to light are made either soluble or insoluble in a solvent. If the exposed regions are soluble, a positive image of the mask is produced in the photoresist. The photoresist is therefore termed a positive photoresist. On the other hand, if the non-irradiated regions are dissolved by the solvent, a negative image results. Hence, the photoresist is referred to as a negative photoresist.

A difficulty that can occur when exposing photoresist to radiation is that waves of radiation can propagate through the photoresist to a layer beneath the photoresist and then be reflected back up through the photoresist to interact with other waves propagating through the photoresist. The reflected waves can constructively and/or destructively interfere with other waves propagating through the photoresist to create periodic variations of light intensity within the photoresist. Such variations of light intensity can cause the photoresist to receive non-uniform doses of energy throughout its thickness. The non-uniform dose can decrease the accuracy and precision with which a masked pattern is transferred to the photoresist. Also, the radiated waves reflected back from a non-flat surface underlying photoresist can enter portions of the photoresist that are not supposed to be exposed. Accordingly, it is desired to develop methods which suppress radiation waves from being reflected by layers beneath a photoresist layer.

A method which has been used with some success to suppress reflected waves is to form an antireflective material beneath a photoresist layer. Antireflective materials can, for example, comprise materials which absorb radiation, and which therefore quench reflection of the radiation.

Antireflective materials absorb various wavelengths of radiation with varying effectiveness. The wavelengths absorbed, and the effectiveness with which they are absorbed, vary depending on the materials utilized. The number of materials available for use as antireflective materials is limited. Accordingly, it is desired to develop alternative methods of varying the wavelengths absorbed, and effectiveness with which the wavelengths are absorbed, for antireflective materials.

SUMMARY OF THE INVENTION

In one aspect, the invention includes a semiconductor processing method wherein an antireflective material layer is formed over a substrate. At least a portion of the antireflective material layer is annealed at a temperature of greater than about 400° C. A layer of photoresist is formed over the annealed antireflective material layer. The layer of photoresist is patterned. A portion of the antireflective material layer unmasked by the patterned layer of photoresist is removed.

In another aspect, the invention includes a semiconductor processing method wherein an antireflective material layer is formed over a substrate. The antireflective material layer is annealed at a temperature of greater than about 400° C. A layer of photoresist is formed over the annealed antireflective material layer. Portions of the layer of photoresist are exposed to radiation waves, some of the radiation waves are attenuated by the antireflective material as the portions are exposed.

In yet another aspect, the invention includes a semiconductor processing method wherein a solid antireflective material layer is formed over a substrate. Optical properties of the antireflective material layer are altered. After altering the optical properties, a layer of photoresist is formed over the antireflective material layer. Portions of the layer of photoresist are exposed to radiation waves. Some of the radiation waves are absorbed by the antireflective material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
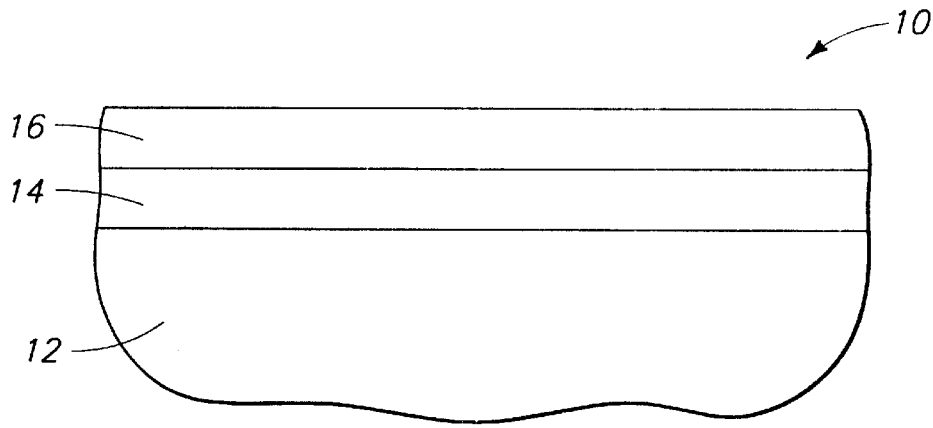
FIG. 1 is a fragmentary, diagrammatic, cross-sectional view of a semiconductor wafer fragment at a preliminary processing step of a method of the present invention.

A method of the present invention is described with reference to FIGS. 1–3. Referring to FIG. 1, a semiconductor wafer fragment 10 is illustrated at a preliminary processing step. Wafer fragment 10 comprises a substrate 12, an overlying antireflective material layer 14, and a photoresist layer 16 over the antireflective material layer 14. The substrate can comprise, for example, a monocrystalline silicon wafer lightly doped with a conductivity-enhancing dopant. To aid in interpretation of this disclosure and the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The antireflective material layer 14 can comprise an inorganic material, such as, for example, a material comprising from about 5% to about 37% (by atomic concentration) oxygen, about 10% to about 35% (by atomic concentration) nitrogen, from about 50% to about 65% (by atomic concentration) silicon, and hydrogen. A specific example inorganic material comprises about 10% (by atomic concentration) nitrogen, about 25% (by atomic concentration) oxygen and about 65% (by atomic concentration) silicon. Antireflective coating layer 14 can, for example, consist of a single substantially homogeneous layer of the above-described inorganic material.

As another example, antireflective coating layer 14 can comprise a stack of materials, with at least one of the materials in the stack being configured to attenuate radiation that passes through the photoresist. The attenuation can encompass either total or partial absorption of such radiation. If the attenuation encompasses only partial absorption, then preferably the radiation that is not absorbed will be reflected at an appropriate wavelength and phase such that it is cancelled by other radiation passing through the stack. In an exemplary configuration of an antireflective layer comprising a stack of materials, the layer comprises a material comprising from about 5% to about 37% (by atomic concentration) oxygen, about 10% to about 35% (by atomic concentration) nitrogen, from about 50% to about 65% (by atomic concentration) silicon, and hydrogen at the bottom of the stack. The remainder of the stack comprises one or more layers that are fully or partially transmissive of the radiation. Such layers can comprise, for example, silicon dioxide.

Photoresist layer 16 can comprise either a negative photoresist or a positive photoresist.

In accordance with the present invention, antireflective material layer 14 is applied over substrate 12 and at least a portion of layer 14 is annealed at a temperature greater than about 400° C. (preferably greater than 400° C.) prior to formation of photoresist layer 16. If the antireflective material includes a portion comprising the above-discussed inorganic materials comprising nitrogen, oxygen, hydrogen and silicon, such portion can be applied by chemical vapor deposition at a temperature of from about 250° C. to about 400°. The portion is then preferably annealed at a temperature of from about 800° C. to about 1050° C., more preferably from about 800° C. to about 900° C., and most preferably about 850° C. During the anneal, the antireflective material layer 14 is preferably exposed to a nitrogen-containing atmosphere, such as an atmosphere comprising $N_2$ and Ar. The atmosphere can, for example, consist essentially of $N_2$.

An anneal of an antireflective material layer at a temperature of greater than about 400° C. has been found to alter optical properties of the antireflective material layer to make the antireflective material layer more absorptive to radiation. Such anneal is particularly beneficial for a portion of an antireflective material layer comprising oxygen, nitrogen, silicon, and hydrogen. Specifically, the anneal has been found to influence a refractive index coefficient (n) of the antireflective material layer and an extinction coefficient (energy absorption coefficient) (k) of the antireflective material layer. For instance, it has been found that an anneal at greater than about 400° C. of a hydrogenated material comprising about 10% (by atomic concentration) nitrogen, about 25% (by atomic concentration) oxygen and about 65% (by atomic concentration) silicon will alter the "n" and "k" of the material exposed to 248 nanometer wavelength light from 2.12 and 1.19, respectively, to 1.89 and 1.41, respectively. Also, the anneal will alter the "n" and "k" of such material when exposed to 365 nanometer wavelength light from 2.67 and 0.59, respectively, to 2.89 and 1.11, respectively. The annealing alters at least one of the refractive index coefficient or the extinction coefficient of the antireflective material layer.

After the anneal of at least a portion of antireflective material layer 14, photoresist layer 16 is formed over antireflective layer 14. Photoresist layer 16 can be formed by conventional methods. An example method includes spinning a photoresist liquid over layer 14 and subsequently volatilizing solids from the layer to form a solid photoresist layer 16.

Figure 2:
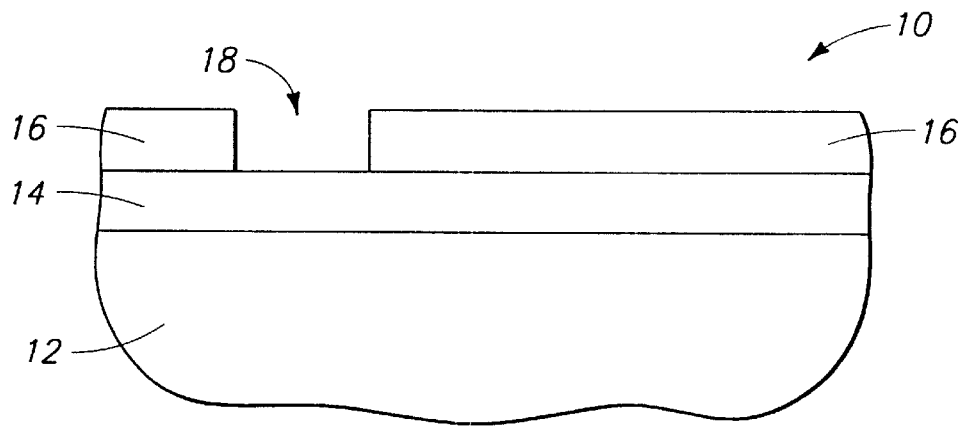
FIG. 2 is a view of the FIG. 1 wafer fragment at a processing step subsequent to that shown in FIG. 1.

Referring to FIG. 2, photoresist layer 16 is patterned by exposing the layer to a patterned beam of radiation. Such patterning can comprise conventional methods such as the negative photoresist processing or positive photoresist processing described in the "Background" section of this disclosure. Portions of photoresist layer 16 that are exposed to the radiation will behave differently in a solvent than will portions unexposed to radiation. Either the portion exposed to radiation or the portion unexposed to radiation is removed from over substrate 12 to leave the other of the portions exposed to radiation or unexposed to radiation remaining over substrate 12. Whether it is the portion that is exposed to radiation that is removed or the portion that is unexposed to radiation that is removed will depend on whether photoresist layer 16 comprises a negative or positive photoresist. The removal of a portion of photoresist layer 16 forms an opening 18 through photoresist layer 16. After formation of opening 18, photoresist layer 16 becomes a patterned mask. A portion of antireflective material layer 14 is covered by the patterned mask 16, and a portion is exposed through opening 18.

During the exposure of photoresist layer 16 to radiation, some of the radiation penetrates through layer 16 and into antireflective material layer 14. Antireflective material layer 14 attenuates, and preferably absorbs such penetrating radiation waves.

Figure 3:
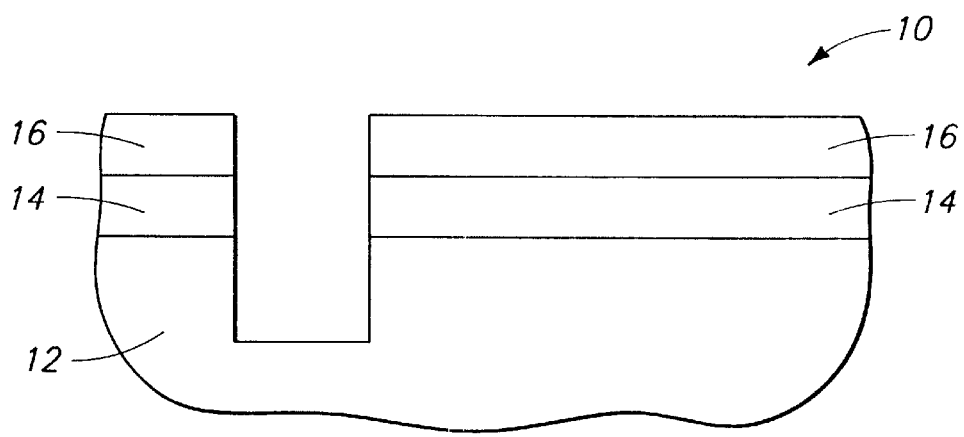
FIG. 3 is a view of the FIG. 1 wafer fragment at a processing step subsequent to that shown in FIG. 2.

Referring to FIG. 3, opening 18 is extended through antireflective material layer 14 and into substrate 12. Opening 18 can be extended by conventional methods, such as, for example, a dry plasma etch or a wet etch.

In the shown embodiment, photoresist layer 16 is against antireflective material layer 14. It is to be understood that in other embodiments of the invention, which are not shown, intervening layers can be formed between photoresist layer 16 and antireflective material layer 14. If such intervening layers are at least partially transparent to the radiation utilized to pattern photoresist layer 16, the radiation will penetrate to antireflective material layer 14 and be absorbed by material layer 14 during exposure of photoresist layer 16 to the radiation. It is also to be understood that if such intervening layers are present, a pattern of layer 16 could be transferred to the intervening layers without extending the pattern to layer 14. Thus, the invention encompasses embodiments in which antireflective material layer 14 is not etched.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:

forming an antireflective material layer over a substrate, the antireflective material layer comprising oxygen, nitrogen and silicon;

after forming the antireflective material, annealing the antireflective material layer at a temperature of at least 800° C.;

forming a layer of photoresist over the annealed antireflective material layer; and exposing portions of the layer of photoresist to radiation waves, some of the radiation waves being attenuated by the antireflective material during the exposing.

2. The method of claim 1 wherein the antireflective material layer comprises from 5% to 37% (by atomic concentration) of the oxygen, from 10% to 35% (by atomic concentration) of the nitrogen, from 50% to 65% (by atomic concentration) of the silicon, and hydrogen.

3. The method of claim 1 wherein the annealing temperature is less than or equal to 1050° C., and wherein the antireflective material layer comprises from 5% to 37% (by atomic concentration) of the oxygen, from 10% to 35% (by atomic concentration) of the nitrogen, from 50% to 65% (by atomic concentration) of the silicon, and hydrogen.

4. A semiconductor processing method comprising:
  forming a solid antireflective material layer over a substrate, the antireflective material layer comprising, from 5% to 37% (by atomic concentration) oxygen, from 10% to 35% (by atomic concentration) nitrogen and from 50% to 65% (by atomic concentration) silicon;
  altering optical properties of the antireflective material layer by annealing the antireflective material layer at a temperature of at least 800° C.;
  after altering the optical properties, forming a layer of photoresist over the antireflective material layer; and
  exposing portions of the layer of photoresist to radiation waves and absorbing some of the radiation waves with the antireflective material.

5. A semiconductor processing method comprising;
  chemical vapor depositing an antireflective material layer onto a semiconductive material substrate at a temperature of from about 300° C. to about 400° C., the antireflective material layer comprising oxygen, nitrogen and silicon;
  annealing the antireflective material layer at a temperature of from 800° C. to 900° C. to alter at least one of an refractive index coefficient or a extinction coefficient of the antireflective material layer;
  forming a layer of photoresist over the annealed antireflective material layer;
  exposing portions of the photoresist to radiation waves while leaving other portions of the photoresist unexposed and absorbing some of the radiation waves with the antireflective material; and
  selectively removing either the exposed or unexposed portions of the photoresist while leaving the other of the exposed and unexposed portions over the substrate.

6. The method of claim 5 wherein the antireflective material layer comprises from 5% to 37% (by atomic concentration) of the oxygen, from 10% to 35% (by atomic concentration) of the nitrogen, from 50% to 65% (by atomic concentration) of the silicon, and hydrogen.

* * * * *